US 10,727,619 B2

United States Patent
Urimoto et al.

(10) Patent No.: US 10,727,619 B2
(45) Date of Patent: Jul. 28, 2020

(54) CONTROL UNIT HAVING PRESS-FIT STRUCTURE (71) Applicant: Mitsubishi Electric Corporation, Tokyo (JP)

(72) Inventors: Kentaro Urimoto, Tokyo (JP); Takahisa Kawaguchi, Tokyo (JP)

(73) Assignee: Mitsubishi Electric Corporation, Chiyoda-ku, Tokyo (JP)

(*) Notice: Subject to any disclaimer, the term of this patent is extended or adjusted under 35 U.S.C. 154(b) by 0 days.

(21) Appl. No.: 16/481,176

(22) PCT Filed: Mar. 6, 2017

(86) PCT No.: PCT/JP2017/008782
§ 371 (c)(1),
(2) Date: Jul. 26, 2019

(87) PCT Pub. No.: WO2018/163247
PCT Pub. Date: Sep. 13, 2018

(65) Prior Publication Data
US 2019/0393629 A1 Dec. 26, 2019

(51) Int. Cl.
H01R 12/58 (2011.01)
H05K 1/18 (2006.01)

(52) U.S. Cl.
CPC .......... *H01R 12/585* (2013.01); *H05K 1/184* (2013.01); *H05K 2201/10878* (2013.01)

(58) Field of Classification Search
CPC ............. H01R 12/585; H05K 1/184; H05K 2201/10878; H05K 3/308
See application file for complete search history.

(56) References Cited

U.S. PATENT DOCUMENTS 4,446,505 A * 5/1984 Long .............. H05K 3/368
361/785
4,676,579 A * 6/1987 Ting ............... H01R 12/58
439/82

(Continued)

FOREIGN PATENT DOCUMENTS

JP 61-502152 A 9/1986
JP 2000-260513 A 9/2000

(Continued)

OTHER PUBLICATIONS

International Search Report for PCT/JP2017/008782 dated Apr. 25, 2017 [PCT/ISA/210].

Primary Examiner — Ross N Gushi
(74) Attorney, Agent, or Firm — Sughrue Mion, PLLC; Richard C. Turner (57) ABSTRACT In a control unit including a press-fit terminal, a substrate includes: a connected portion into which the press-fit terminal is connected; and a guide member, which surrounds a periphery of the connected portion and extends from the substrate. The press-fit terminal includes: a connecting portion formed on a tip end side of the press-fit terminal; and an enlarged portion formed adjacent to the connecting portion. The guide member includes: an opening portion, which opens in a direction in which the press-fit terminal is positioned; a guide hole extending from the opening portion to the substrate; and a reduced-hole portion formed adjacent to the opening portion. The guide hole is configured such that, when the connecting portion of the press-fit terminal is connected to the connected portion of the substrate, the enlarged portion of the press-fit terminal closes the reduced-hole portion of the guide hole.

4 Claims, 6 Drawing Sheets

(56) References Cited

U.S. PATENT DOCUMENTS

| | | | |
|---|---|---|---|
| 4,753,602 A | 6/1988 | Peyrat et al. | |
| 4,939,624 A * | 7/1990 | August | H01R 12/523 361/714 |
| 4,955,819 A * | 9/1990 | Harting | H01R 12/712 29/213.1 |
| 5,213,514 A * | 5/1993 | Arai | H01R 12/727 439/79 |
| 5,340,319 A * | 8/1994 | Enomoto | H01R 12/523 439/75 |
| 5,453,016 A * | 9/1995 | Clark | H01R 43/205 439/79 |
| 5,511,984 A * | 4/1996 | Olson | H01R 13/193 439/701 |
| 5,567,167 A * | 10/1996 | Hayashi | H01R 12/523 439/75 |
| 5,591,036 A * | 1/1997 | Doi | H01R 43/205 439/79 |
| 5,676,554 A * | 10/1997 | Tsuji | H01R 12/7005 439/79 |
| 5,761,050 A * | 6/1998 | Archer | H01R 12/585 361/744 |
| 5,863,222 A * | 1/1999 | Kinsey, Jr. | H01R 13/658 439/607.53 |
| 5,921,789 A * | 7/1999 | Makino | H01R 12/716 439/590 |
| 6,068,494 A * | 5/2000 | Tokuwa | H01R 12/716 439/79 |
| 6,077,092 A * | 6/2000 | Chiu | H01R 12/724 439/79 |
| 6,159,040 A * | 12/2000 | Chang | H01R 12/716 439/541.5 |
| 6,161,283 A * | 12/2000 | Tokuwa | H01R 12/716 29/876 |
| 6,305,949 B1 * | 10/2001 | Okuyama | H01R 12/585 439/75 |
| 6,361,373 B1 * | 3/2002 | Horchler | H01R 43/20 439/701 |
| 6,494,724 B1 * | 12/2002 | Bixler | H01R 13/506 439/79 |
| 6,623,280 B2 * | 9/2003 | Oldenburg | H01R 12/52 439/590 |
| 6,702,593 B2 * | 3/2004 | Ogawa | H01R 13/748 439/79 |
| 6,719,573 B2 * | 4/2004 | Koehler | H01R 12/585 29/837 |
| 6,817,870 B1 * | 11/2004 | Kwong | H05K 3/368 409/66 |
| 6,866,523 B2 * | 3/2005 | Yamashita | H01R 12/58 439/79 |
| 6,953,372 B2 * | 10/2005 | Takada | H01R 13/41 439/682 |
| 6,997,756 B2 * | 2/2006 | Nakamura | H01R 13/41 439/733.1 |
| 7,033,229 B2 * | 4/2006 | Tsuchiya | H01R 13/41 439/733.1 |
| 7,037,146 B2 * | 5/2006 | Nakamura | H01R 12/585 439/751 |
| 7,048,552 B2 * | 5/2006 | Sakata | H01R 12/58 439/733.1 |
| 7,048,595 B2 * | 5/2006 | Nakamura | H01R 12/585 439/75 |
| 7,059,872 B2 * | 6/2006 | Tanaka | H01R 12/7047 439/79 |
| 7,175,480 B2 * | 2/2007 | Yamashita | H01R 13/41 439/733.1 |
| 7,214,074 B2 * | 5/2007 | Osada | H01R 12/712 439/79 |
| 7,300,290 B2 * | 11/2007 | Yamagami | H01R 12/724 439/569 |
| 7,331,801 B1 * | 2/2008 | Eichorn | H01R 12/724 439/76.1 |
| 7,361,031 B2 * | 4/2008 | Matsumura | H01R 12/585 29/845 |
| 7,377,823 B2 * | 5/2008 | Chen | H01R 12/585 439/751 |
| 7,445,499 B2 * | 11/2008 | Nunokawa | H01R 12/585 439/567 |
| 7,458,148 B2 * | 12/2008 | Matsumura | H01R 43/20 29/837 |
| 7,488,219 B2 * | 2/2009 | Matsumura | H01R 12/585 439/751 |
| 7,494,344 B2 * | 2/2009 | Galauner | A61M 11/041 439/67 |
| 7,717,721 B2 * | 5/2010 | Wu | H01R 12/712 439/540.1 |
| 7,722,413 B2 * | 5/2010 | Tonosaki | H01R 13/41 439/733.1 |
| 7,874,850 B2 * | 1/2011 | Yamagami | H01R 12/707 439/79 |
| 8,269,116 B2 * | 9/2012 | Ambo | H05K 5/0069 174/541 |
| 8,435,051 B2 * | 5/2013 | Tonosaki | H01R 12/724 439/567 |
| 8,545,237 B2 * | 10/2013 | Johnson | H01R 12/523 439/75 |
| 8,579,638 B2 * | 11/2013 | Schaarschmidt | H01R 12/585 439/82 |
| 8,727,815 B1 * | 5/2014 | Mongold | H01R 43/205 439/751 |
| 9,077,113 B2 * | 7/2015 | Chastanet | H01R 13/64 |
| 9,106,009 B2 * | 8/2015 | Zhao | H01R 12/585 |
| 9,214,760 B2 * | 12/2015 | Endo | H01R 13/58 |
| 9,252,508 B2 * | 2/2016 | Endo | H01R 12/7082 |
| 9,293,870 B1 * | 3/2016 | Koczwara | H05K 5/0069 |
| 9,419,364 B2 * | 8/2016 | Devos | H01R 13/41 |
| 9,431,733 B1 * | 8/2016 | Heistand | H01R 43/16 |
| 9,559,451 B2 * | 1/2017 | Uchida | H01R 12/585 |
| 9,585,253 B2 * | 2/2017 | Matsumoto | H01R 12/71 |
| 9,634,407 B2 * | 4/2017 | Endo | H01R 12/585 |
| 9,843,116 B2 * | 12/2017 | Endo | H01R 13/506 |
| 9,882,295 B2 * | 1/2018 | Miura | H01R 12/724 |
| 10,044,121 B2 * | 8/2018 | Shimizu | H01R 12/585 |
| 10,505,303 B2 * | 12/2019 | Hoyack | H01R 12/91 |
| 2003/0049972 A1 * | 3/2003 | Aoki | H01R 12/585 439/751 |
| 2003/0092296 A1 * | 5/2003 | Oldenburg | H01R 12/52 439/75 |
| 2003/0166348 A1 * | 9/2003 | Martin | H01R 12/724 439/79 |
| 2004/0097139 A1 * | 5/2004 | Takada | H01R 13/41 439/733.1 |
| 2004/0180582 A1 * | 9/2004 | Nakamura | H01R 13/41 439/733.1 |
| 2004/0192086 A1 * | 9/2004 | Aoki | H01R 12/585 439/82 |
| 2004/0219841 A1 * | 11/2004 | Yamashita | H01R 13/41 439/733.1 |
| 2004/0235317 A1 * | 11/2004 | Schiefer | H05K 1/181 439/76.2 |
| 2005/0070139 A1 * | 3/2005 | Kaneko | H01R 12/585 439/82 |
| 2005/0085109 A1 * | 4/2005 | Tanaka | H01R 12/7047 439/79 |
| 2005/0142905 A1 * | 6/2005 | Maejima | H01R 12/523 439/76.2 |
| 2005/0159038 A1 * | 7/2005 | Tsuchiya | H01R 13/41 439/352 |
| 2005/0250356 A1 * | 11/2005 | Matsumura | H01R 12/585 439/82 |
| 2005/0277312 A1 * | 12/2005 | Nakamura | H01R 12/585 439/82 |
| 2007/0077813 A1 * | 4/2007 | Matsumura | H01R 12/585 439/578 |
| 2007/0164475 A1 * | 7/2007 | Nagashima | B29C 45/0046 264/259 |
| 2007/0197059 A1 * | 8/2007 | Tanaka | H01R 12/7017 439/79 |

(56) References Cited

U.S. PATENT DOCUMENTS

| | | | | |
|---|---|---|---|---|
| 2007/0270001 | A1* | 11/2007 | Matsumura | H01R 12/585 439/82 |
| 2008/0050946 | A1* | 2/2008 | Nunokawa | H01R 12/585 439/82 |
| 2008/0050947 | A1* | 2/2008 | Nunokawa | H01R 12/585 439/82 |
| 2008/0182438 | A1* | 7/2008 | Fedder | H01R 12/585 439/108 |
| 2009/0117755 | A1* | 5/2009 | Tonosaki | H01R 13/41 439/55 |
| 2010/0300723 | A1* | 12/2010 | Ambo | H05K 5/0069 174/59 |
| 2011/0053427 | A1* | 3/2011 | Tung | H01R 13/4361 439/660 |
| 2012/0003847 | A1* | 1/2012 | Johnson | H01R 12/523 439/65 |
| 2012/0156898 | A1* | 6/2012 | Kallee | H01R 12/585 439/65 |
| 2013/0344744 | A1* | 12/2013 | Chastanet | H01R 12/724 439/626 |
| 2014/0179173 | A1* | 6/2014 | Suzuki | H01R 12/585 439/751 |
| 2014/0302723 | A1* | 10/2014 | Zhao | H01R 12/585 439/751 |
| 2014/0342619 | A1* | 11/2014 | Uchida | H01R 12/585 439/751 |
| 2015/0038023 | A1* | 2/2015 | Devos | H01R 13/41 439/752.5 |
| 2015/0118871 | A1* | 4/2015 | Yagi | H01R 12/523 439/65 |
| 2016/0276761 | A1* | 9/2016 | Endo | H01R 13/4362 |
| 2016/0336663 | A1* | 11/2016 | Miyazaki | H01R 12/585 |
| 2019/0131723 | A1* | 5/2019 | Txarola | H01R 4/2429 |
| 2019/0221957 | A1* | 7/2019 | Schneider | H01R 13/04 |
| 2019/0393629 | A1* | 12/2019 | Urimoto | H01R 12/585 |
| 2020/0076099 | A1* | 3/2020 | Chalas | H01R 13/6471 |

FOREIGN PATENT DOCUMENTS

| | | |
|---|---|---|
| JP | 2003-022856 A | 1/2003 |
| JP | 2014-235977 A | 12/2014 |
| JP | 2016-127780 A | 7/2016 |

* cited by examiner

FIG. 8 though holes (see, for example, Patent Literature 1).

CONTROL UNIT HAVING PRESS-FIT STRUCTURE

CROSS REFERENCE TO RELATED APPLICATIONS

This application is a National Stage of International Application No. PCT/JP2017/008782, filed on Mar. 6, 2017.

TECHNICAL FIELD

The present invention relates to a guide member configured to guide a press-fit terminal into a through hole of a substrate in a control unit having a press-fit structure.

BACKGROUND ART

In a related-art control unit having a press-fit structure, terminals such as connectors are press-fitted into conductive through holes formed in a substrate to be electrically connected. When such a control unit is assembled, the press-fit terminals to be press-fitted are required to be positioned with high precision with respect to the through holes.

For that reason, protruding portions are formed in a member configured to hold the press-fit terminals, and recessed portions are formed in a member configured to hold the substrate. The protruding portions are fitted into the recessed portions so that the press-fit terminals are inserted into the through holes (see, for example, Patent Literature 1).

Further, when the press-fit terminals are press-fitted into the through holes, scraps may be generated from the through holes. When the scraps are moved and adhere to a wiring pattern on the substrate or mounted electronic components, abnormality such as a short-circuit may occur.

Consequently, in order that the scraps generated from the through hole are prevented from being moved to other portions, the substrate support portion side is formed to have such a shape as to surround an entire periphery of through holes (see, for example, Patent Literature 1).

CITATION LIST

Patent Literature

[PTL 1] JP 2015-127780 A

SUMMARY OF INVENTION

Technical Problem

However, in the device of Patent Literature 1, the press-fit terminal is not directly positioned with respect to the through hole, and hence there are some cases that the press-fit terminal cannot be inserted into the through hole.

Further, in the device of Patent Literature 1, when the scraps generated from the through holes are moved to the mounting portion of the substrate, there is a fear in that abnormality such as a short-circuit may occur.

The present invention has been made to solve the problems described above, and an object of the present invention is to obtain a control unit having a press-fit structure capable of simplifying the positioning of the press-fit terminals with respect to through holes formed in a substrate to improve ease of assembly, and of suppressing an influence on electronic components due to movement of scraps generated from the through holes.

Solution to Problem

According to one embodiment of the present invention, there is provided a control unit having a press-fit structure, including a connector assembly body and a substrate assembled to each other, the connector assembly body including a press-fit terminal, the substrate including: a connected portion into which the press-fit terminal is connected; and a guide member, which surrounds a periphery of the connected portion and extends from the substrate, the press-fit terminal including: a connecting portion formed on a tip end side of the press-fit terminal; and an enlarged portion formed adjacent to the connecting portion, the guide member including: an opening port ion, which opens in a direction in which the press-fit terminal is positioned; a guide hole extending from the opening portion to the substrate; and a reduced-hole portion formed adjacent to the opening portion, the guide hole being configured such that, when the connecting portion of the press-fit terminal is connected to the connected portion of the substrate, the enlarged portion of the press-fit terminal closes the reduced-hole portion of the guide hole.

Advantageous Effects of Invention

According to the control unit having a press-fit structure of the present invention, even when a positional deviation occurs between the press-fit terminal and the through hole, the press-fit terminal is guided to be inserted into the through hole, thereby being capable of improving ease of assembly. Further, through the suppression on movement of scraps generated from the through hole, occurrence of abnormality such as a short-circuit can be prevented.

DESCRIPTION OF EMBODIMENTS

Now, with reference to the drawings, a control unit having a press-fit structure according to exemplary embodiments of the present invention is described.

First Embodiment

Figure 1:
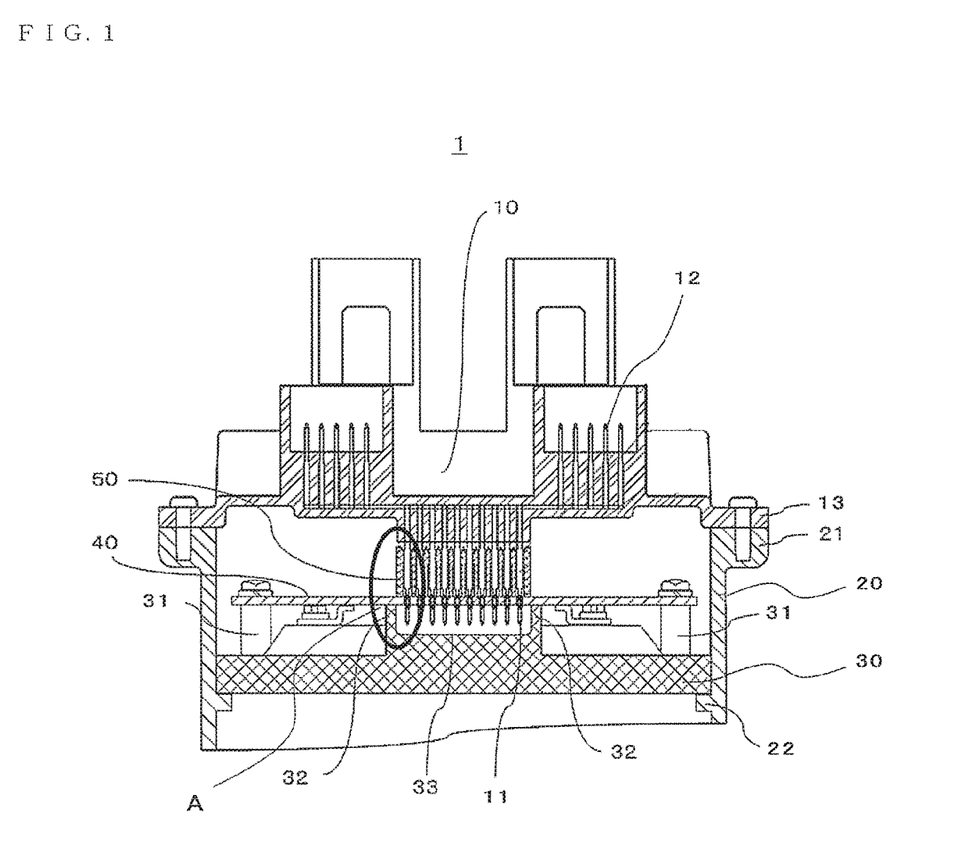
FIG. 1 is a sectional view of a control unit having a press-fit structure according to a first embodiment of the present invention as viewed from a front side of the control unit.
Figure 2:
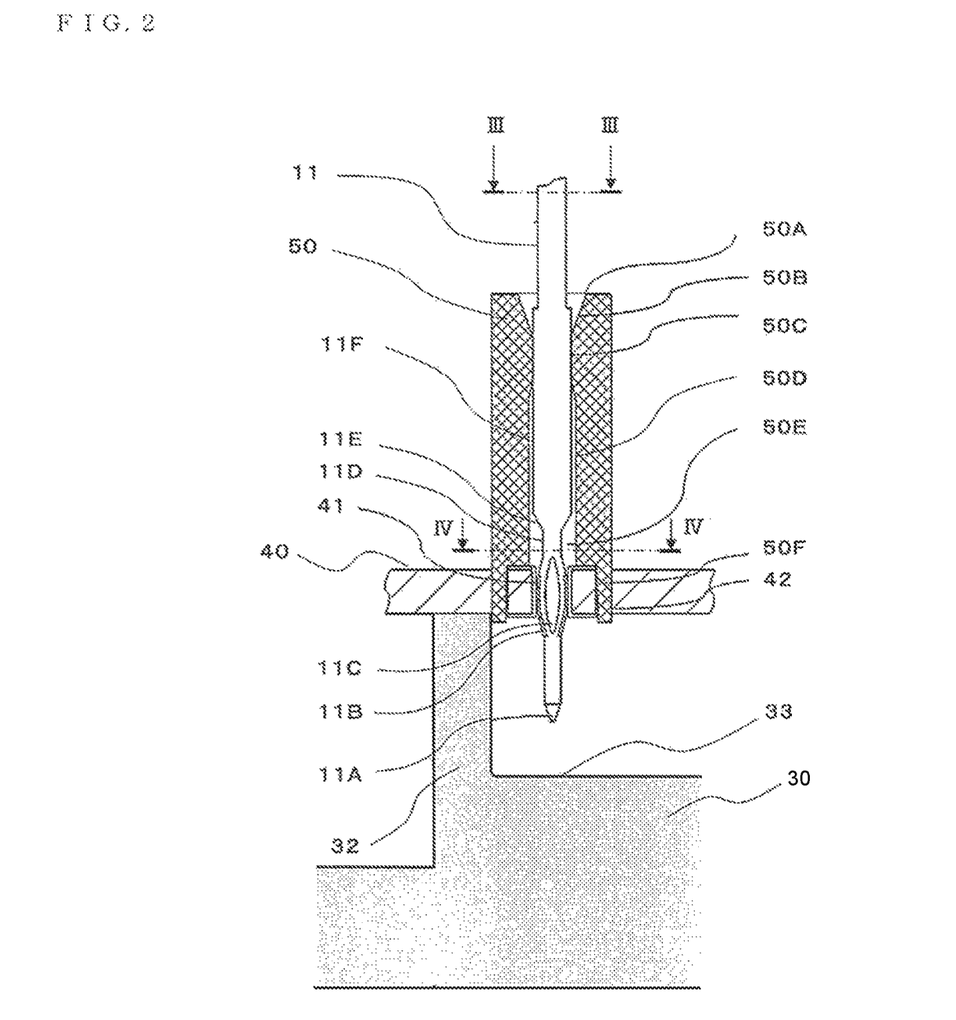
FIG. 2 is an enlarged view of a portion "A" of FIG. 1, for illustrating a press-fit terminal and a guide member of a substrate.
Figure 3:
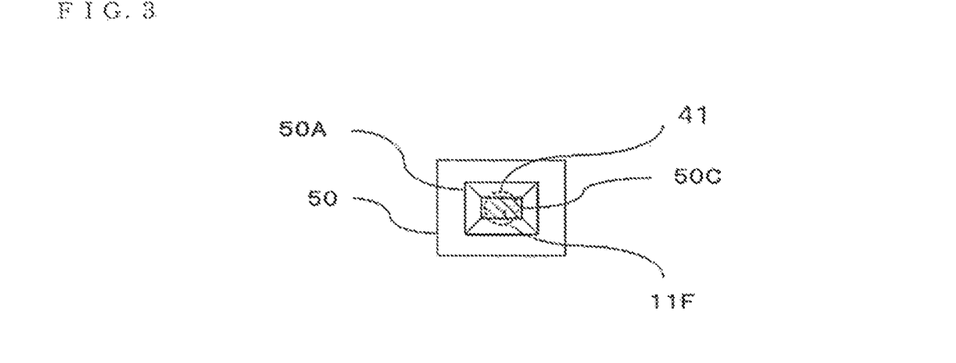
FIG. 3 is a sectional view taken along the line III-III of FIG. 2.
Figure 4:
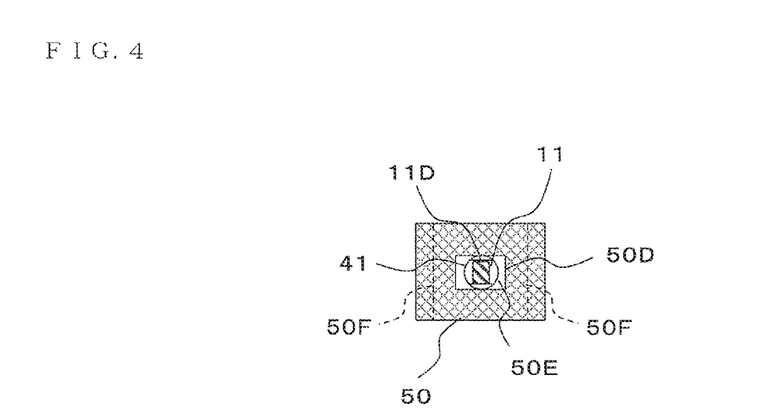
FIG. 4 is a sectional view taken along the line IV-IV of FIG. 2.

FIG. 1 is a sectional view of a control unit 1 having a press-fit structure according to a first embodiment of the present invention as viewed from a front side of the control unit 1. FIG. 2 is an enlarged view of a portion "A" of FIG. 1. Further, FIG. 3 is a sectional view taken along the line III-III of FIG. 2, and FIG. 4 is a sectional view taken along the line IV-IV of FIG. 2.

As illustrated in FIG. 1, the control unit 1 having a press-fit structure according to the first embodiment includes a connector ASSY 10, a substrate 40, a base 30 on which the substrate 40 is mounted, and a cover 20 in which the base 30 is accommodated.

The connector ASSY 10 includes a plurality of fixing portions 13. The cover 20 includes a plurality of cover fixing portions 21. The fixing portions 13 and the cover fixing portions 21 are formed at posit ions corresponding to each other. The connector ASSY 10 and the cover 20 are joined and fixed by the fixing portions 13 and the cover fixing portions 21 corresponding to each other. Further, the connector ASSY 10 includes a plurality of connector terminals 12 to which a connector (not shown) is connected, and a plurality of press-fit terminals 11 electrically connected to the respective connector terminals 12.

A wiring pattern (not shown) is formed and electronic components are mounted on the substrate 40. Then, as illustrated in FIG. 2, a through hole 41 is formed in the substrate 40. The press-fit terminal 11 of the connector ASSY 10 is press-fitted into the through hole 41. The through holes 41 are formed as the same number as the press-fit terminals 11 of the connector ASSY 10, and are each coated with a conductive material by plating.

Further, as illustrated in FIG. 2, a guide member 50 formed by molding an insulating resin is mounted to the substrate 40. Further, a guide hole 50E passing through the guide member is formed in the guide member 50. The press-fit terminal 11 is configured to pass through the guide hole 505 to be press-fitted into the through hole 41 of the substrate 40.

The connector ASSY 10 is formed with respect to the cover 20 such that, when the connector ASSY 10 is assembled to the cover 20, a gap is formed between an upper end of the guide member 50 and the connector ASSY 10. With this configuration, when the plurality of press-fit terminals 11 mounted to the connector ASSY 10 are inserted into the guide members 50, portions of the connector ASSY 10 fixing the press-fit terminals 11 are not brought into contact with the guide members 50. Thus, breakage of the guide members 50 and the substrate 40 due to collision of the connector ASSY 10 against the guide members 50 can be prevented.

As illustrated in FIG. 2, the press-fit terminal 11 has a tapered-off tip end portion 11A, an elastic leg portion 11B, a reduced portion 11B, and an enlarged portion 11F. Then, an inclined portion 11B is formed between the reduced portion 11B and the enlarged portion 11F. The press-fit terminal 11 is formed of, for example, a metal plate such as copper which is cut and bent. The cross-section thereof has a rectangular shape as illustrated in FIG. 3. The elastic leg portion 11B of the press-fit terminal 11 is formed around an elongated hole 11C passing through the press-fit terminal 11 in a direction perpendicular to a longitudinal direction of the press-fit terminal 11. The elongated hole 11C of the elastic leg portion 11B is elastically deformed when press-fitted into the through hole 41 of the substrate 40, and is electrically and mechanically connected to an inner wall of the through hole 41.

As illustrated in FIG. 2, the guide hole 50E of the guide member 50 has an opening portion 50A, a tapered surface 50B formed in the opening portion 50A, a reduced-hole portion 50C adjacent to the tapered surface 50B, and an enlarged-hole portion 50D adjacent to the reduced-hole portion 50C. As illustrated in FIG. 3, an outer shape of the guide member 50 and a shape of the opening portion 50A have a rectangular shape. Further, a cross-sectional shape of the reduced-hole portion 50C is a rectangular shape to correspond to a cross-sectional shape of the press-fit terminal 11. The cross-sectional shape of the enlarged-hole portion 50D is not limited to a rectangle shape, but may be a circular, an elliptical, or an elongated circular shape.

As illustrated in FIG. 2 and FIG. 3, the opening portion 50A of the guide member 50 is formed to be larger than an inner dimension of the through hole 41 of the substrate 40. Further, the tapered surface 50B formed in the opening portion 50A is continuous to the reduced-hole portion 50C, and has an inner dimension decreasing as separating away from the opening portion 50A. Further, as illustrated in FIG. 3, the reduced-hole portion 50C is formed to have substantially the same size as the cross-sectional shape of the enlarged portion 11F of the press-fit terminal 11. Thus, FIG. 2 is an illustration of a state in which the guide hole 50E of the guide member 50 is closed by the enlarged portion 11F of the press-fit terminal 11. Consequently, scraps generated on the guide member 50 side of the substrate 40 are confined within the guide hole 50E and are not released to an outside of the substrate 40.

Further, the guide member 50 has a leg portion 50F for positioning on the substrate 40. As illustrated in FIG. 2 and FIG. 4, the leg portion 50F is a rib, which extends from an end portion of the guide member 50 opposite to the opening portion 50A. Meanwhile, the substrate 40 has a positioning hole 42 into which the leg portion 50F is fitted. The leg portion 50F of the guide member 50 is fitted into the positioning hole 42 of the substrate 40 to be positioned with respect to the substrate 40. Through the positioning of the guide member 50 with respect to the substrate 40, a center of the guide hole 50E is positioned at a center of the through hole 41. Then, the guide member 50 is fixed to the substrate 40 to surround a periphery of the through hole 41.

Even when there is no abnormality such as a large bend or deformation on each press-fit terminal 11, a position of each press-fit terminal 11 in the connector ASSY 10 may be positionally sifted in a range of machining error in the press-fit terminal 11 and in a range of mounting error to the connector ASSY 10.

When the position of the press-fit terminal 11 is shifted, the tip end portion 11A of the press-fit terminal 11 may be brought into contact with the opening portion 50A at a time of insertion of the press-fit terminal 11 into the guide hole 50E. However, the guide member 50 of the first embodiment includes the tapered surface 50B in the opening portion 50A, and hence the tip end portion 11A in contact with the tapered surface 50B is guided to the reduced-hole portion 50C along the tapered surface 50B.

Further, when the position of the press-fit terminal 11 is shifted, the enlarged portion 11F of the press-fit terminal 11 may be brought into contact with the opening portion 50A of the guide hole 50E. However, the inclined portion 11E is formed between the reduced portion 11D and the enlarged portion 11F of the press-fit terminal 11. With this configuration, the inclined portion 11E is brought into contact with the tapered surface 50B, and the enlarged portion 11F is guided to the reduced-hole portion 50C along the tapered surface 50B.

Next, description is given of the base 30. As illustrated in FIG. 1, the base 30 is fixed to a base fixing portion 22 formed on an inner wall of the cover 20. Further, as illustrated in FIG. 2, the base 30 includes a recessed portion 33 and a substrate support portion 32 surrounding a periphery of the recessed portion 33. When the press-fit terminal 11 is press-fitted into the through hole 41, the substrate support portion 32 receives a load applied to the substrate 40 to prevent the bending and damage in the substrate 40.

The substrate 40 is, in a state of being placed on the substrate support portion 32, fixed to the base 30 by a plurality of fixing members 31. Lower portions of the plurality of through holes 41 formed in the substrate 40 are opposed to the recessed portion 33. Accordingly, the recessed portion 33 forms a closed space in association with the substrate 40 and the substrate support portion 32.

Thus, according to the control unit 1 having the press-fit terminal of the first embodiment, the press-fit terminal 11 includes the tip end portion 11A, the reduced portion 11D, the inclined portion 11E, and the enlarged portion 11F. Further, the guide member 50 of the substrate 40 includes the opening portion 50A having the tapered surface 50B, and the reduced-hole portion 50C. Then, when the tip end portion 11A or the inclined portion 11E is brought into contact with the tapered surface 50B due to the positional deviation of the press-fit terminal 11, the tip end portion 11A or the inclined portion 11E is moved along the tapered surface 50B to be guided to the reduced-hole portion 50C. Consequently, the tip end portion 11A of the press-fit terminal 11 can be guided into the through hole 41 even when there is positional deviation in an error range in a position of the press-fit terminal 11. As a result, the positioning of the press-fit terminal 11 into the through hole 41 is facilitated, and the ease of assembly of the connector ASSY 10 on the substrate 40 can be improved.

Further, according to the control unit 1 having the press-fit terminal of the first embodiment, when the press-fit terminal 11 is press-fitted and fixed into the through hole 41, the opening portion 50A side and the substrate 40 side of the guide hole 50E of the guide member 50 are closed by the enlarged portion 11F of the press-fit terminal 11 to be separated at the reduced-hole portion 50C of the guide hole 50E. With this configuration, when the press-fit terminal 11 is press-fitted into the through hole 41, scraps generated on the guide member 50 side of the through hole 41 can be confined within the guide hole 50E. As a result, the scraps are prevented from being released to the outside to adhere to the electronic components, and hence abnormality such as a short-circuit can be prevented.

Still further, the recessed portion 33 of the base 30 is formed to surround the through hole 41 on a side of the through hole 41 opposite to the guide member 50 across the substrate 40. Thus, when the press-fit terminal 11 is press-fitted into the through hole 41, scraps generated at a position of the through hole 41 opposite to the guide member 50 across the substrate 40 can be confined in the recessed portion 33. As a result, the scraps are prevented from being released to the outside to adhere to the electronic components, and hence abnormality such as a short-circuit can be prevented.

In the first embodiment, the cross-section of the tapered surface 50B of the guide hole 50E has a straight shape, but may have a curved shape, or may have a shape formed by combining straight lines having different gradients or curves having different curvatures. Further, the opening portion 50A has a rectangular shape, but may have an elliptical or circular shape.

Figure 5:
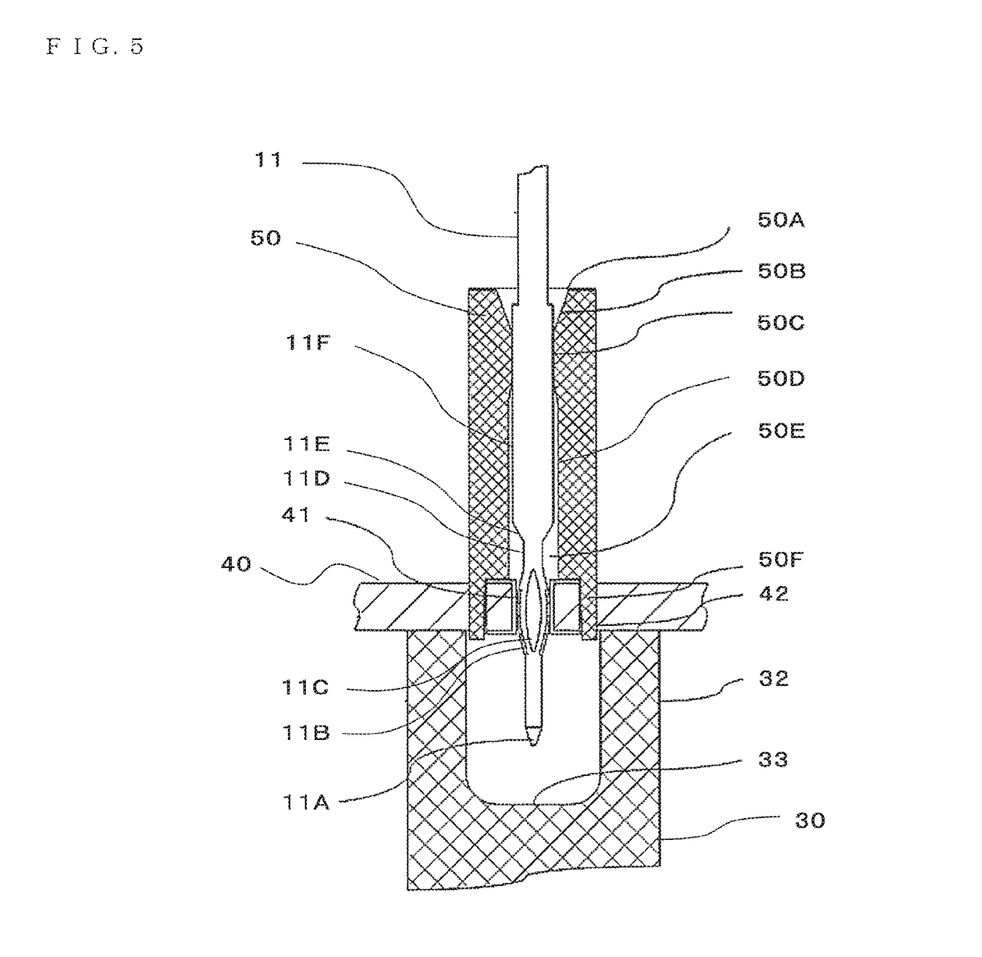
FIG. 5 is a view for illustrating a first modification example of the guide member according to the first embodiment.

Still further, in the first embodiment, as illustrated in FIG. 1, one recessed portion 33 of the base 30 is opposed to the plurality of through holes 41 of the substrate 40, but is not limited thereto. For example, as illustrated in a first modification example of FIG. 5, one recessed portion 33 may be formed for one through hole 41.

Figure 6:
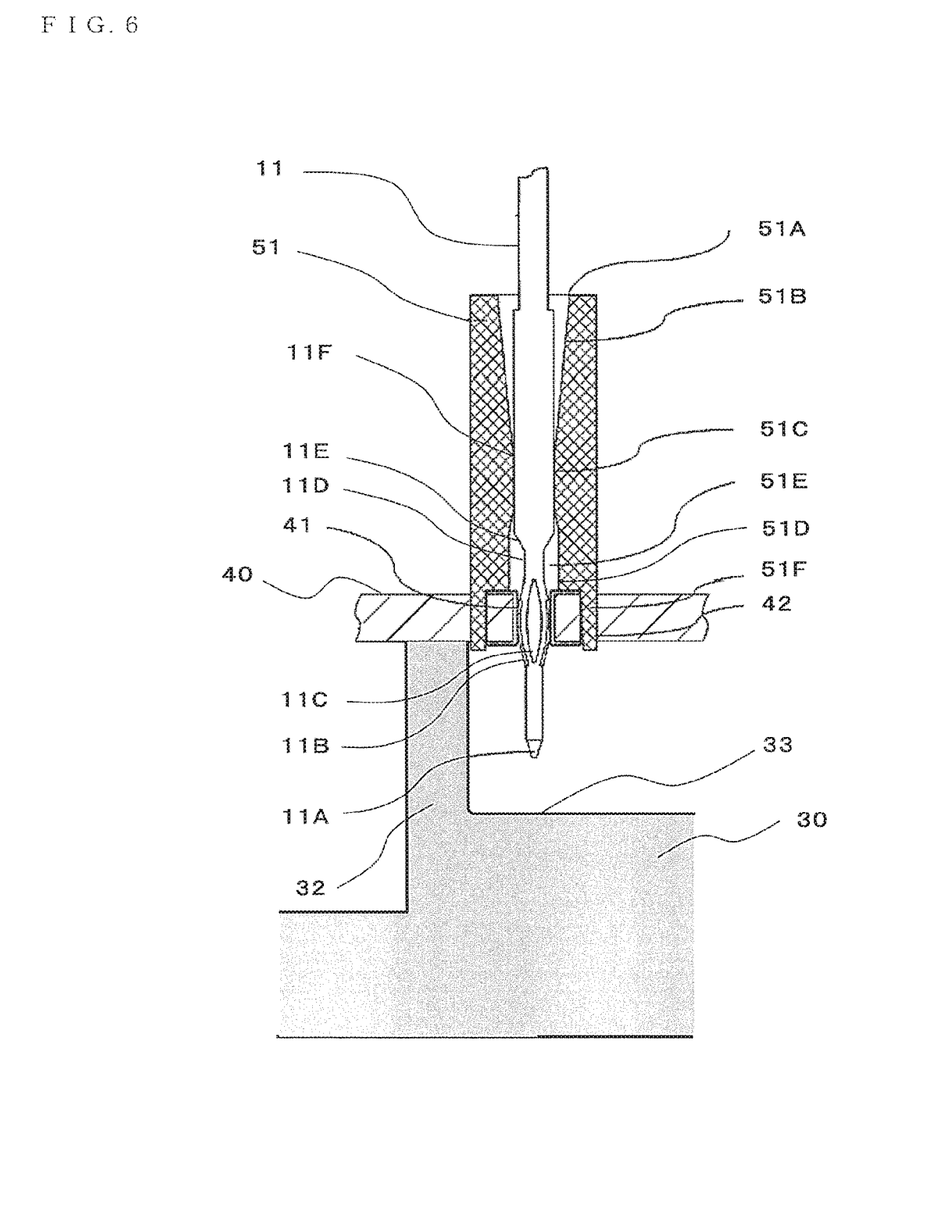
FIG. 6 is a view for illustrating a second modification example of the guide member according to the first embodiment.

Then, in the first embodiment, as illustrated in FIG. 2, the reduced-hole portion 50C of the guide hole 50E is formed only on the opening portion 50A side of the guide hole 50E, but is not limited thereto. For example, as a guide member 51 of a second modification example illustrated in FIG. 6, a tapered surface 51B is extended to form a reduced-hole portion 51C on the substrate 40 side. Thus, when the tip end portion 11A or the inclined portion 11E of the press-fit terminal 11 is brought into contact with the tapered surface 51B, a resistance applied to the press-fit terminal 11 can be reduced.

Figure 7:
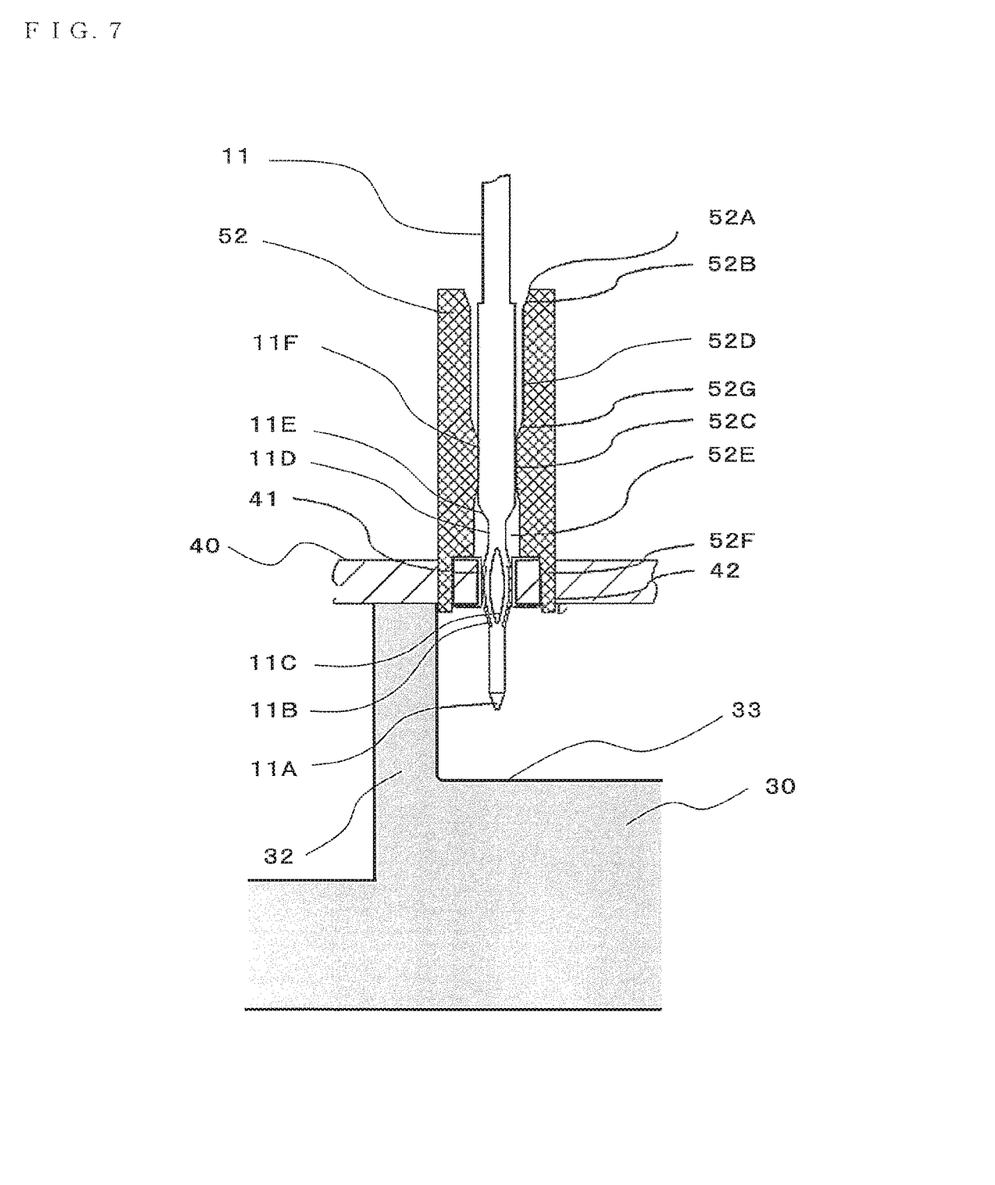
FIG. 7 is a view for illustrating a third modification example of the guide member according to the first embodiment.
Figure 8:
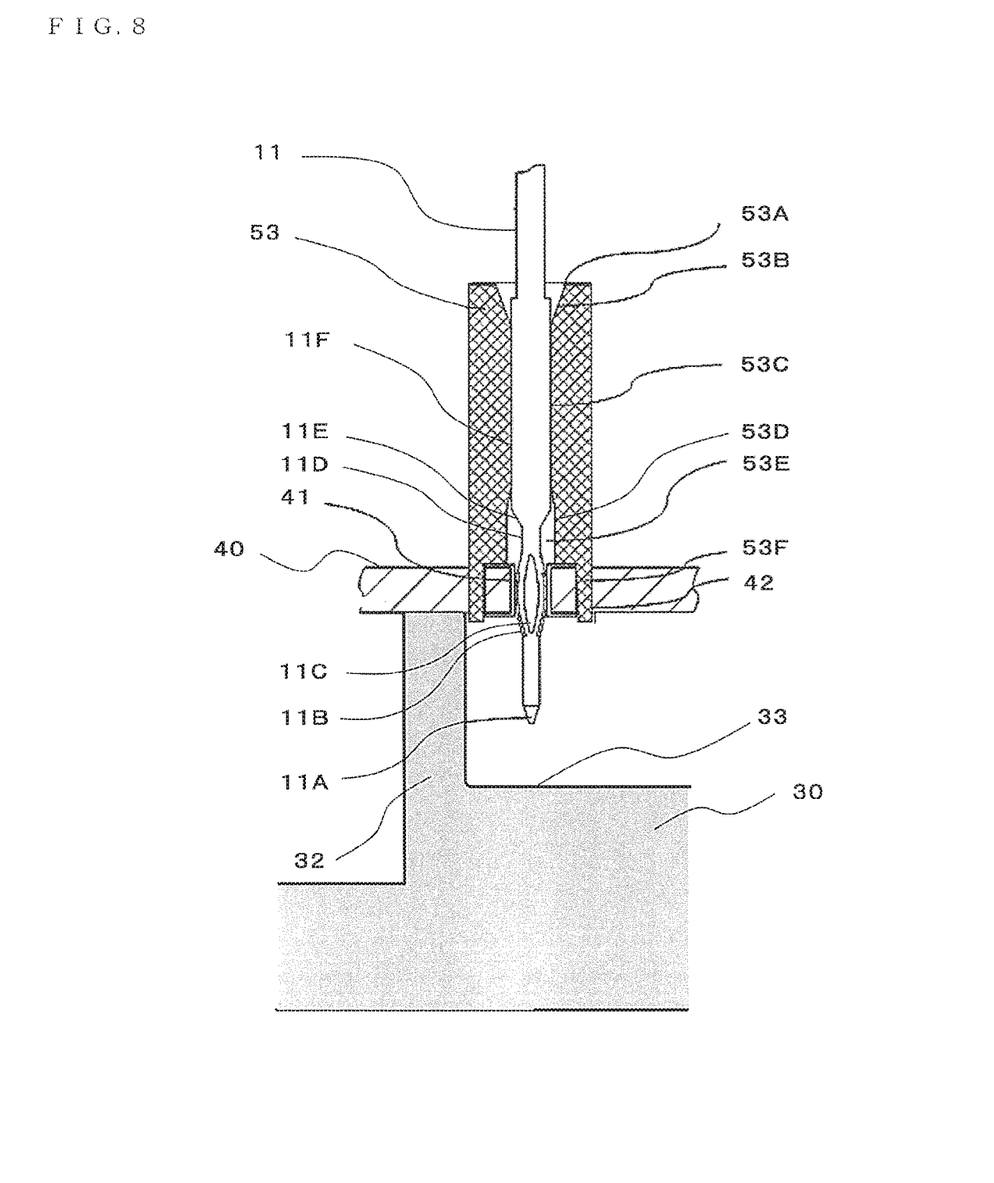
FIG. 8 is a view for illustrating a fourth modification example of the guide member according to the first embodiment.

Further, as a guide member 52 of a third modification example as illustrated in FIG. 7, an enlarged-hole portion 52D may be formed between a tapered surface 52B and a reduced-hole portion 52C. Consequently, the press-fit terminal 11 can be guided into the through hole 41 at a position closer to the through hole 41. Still further, as a guide member 53 of a fourth modification example illustrated in FIG. 8, a reduced-hole portion 53C may be extended from an opening portion 53A of a guide hole 53E to a vicinity of the substrate 40. As a result, scraps generated from the through hole 41 can be positively confined within the guide hole 53E of the guide member 53.

Yet further, in the first embodiment, the guide member 50 is fixed to the substrate 40 by the leg portion 50F for positioning, but is not limited thereto. For example, the guide member 50 may be integrally molded with the substrate 40. Then, in the first embodiment, the reduced-hole portion 50C of the guide hole 50E is formed only at one location, but is not limited thereto. For example, the reduced-hole portion 50C may be formed at two or more locations. Further, in the first embodiment, the press-fit terminal 11 has a shape having the elastic leg portion 11B, in which the elongated hole 11C is formed, but is not limited thereto. For example, the press-fit terminal 11 may have other shapes.

REFERENCE SIGNS LIST 1 control unit, 10 connector ASSY (connector assembly body), 11 press-fit terminal, 11A tip end portion, 11B elastic leg portion, 11C elongated hole, 11D reduced portion, 11E inclined portion, 11F enlarged portion, 12 connector terminal, 13 fixing portion, 20 cover, 21 cover fixing portion, 22 base fixing portion, 30 base, 31 fixing member, 32 substrate support portion, 33 recessed portion, 40 substrate, 41 through hole, 50 to 53 guide member, 50A to 53A opening portion, 50B to 53B tapered surface, 50C to 53C reduced-hole portion, 50D to 53D enlarged-hole portion, 50E to 53E guide hole, 50F to 53F leg portion

The invention claimed is:

1. A control unit having a press-fit structure, comprising a connector assembly body and a substrate assembled to each other, the connector assembly body including a press-fit terminal, the substrate including:

a connected portion into which the press-fit terminal is connected; and a guide member, which surrounds a periphery of the connected portion and extends from the substrate, the press-fit terminal including:

a connecting portion formed on a tip end side of the press-fit terminal; and an enlarged portion formed adjacent to the connecting portion, the guide member including:

an opening portion, which opens in a direction in which the press-fit terminal is positioned;

a guide hole extending from the opening portion to the substrate; and a reduced-hole portion formed adjacent to the opening portion, the guide hole being configured such that, when the connecting portion of the press-fit terminal is connected to the connected portion of the substrate, the enlarged portion of the press-fit terminal closes the reduced-hole portion of the guide hole.

2. The control unit having a press-fit structure according to claim 1,
wherein the guide member includes a tapered surface which is formed inside the opening portion and has an inner dimension decreasing as separating away from the opening portion.

3. The control unit having a press-fit structure according to claim 1, further comprising a base member configured to support the substrate at a position of being opposed to the guide member across the substrate,
wherein the base member includes a recessed portion configured to surround a periphery of the connected portion of the substrate.

4. The control unit having a press-fit structure according to claim 3,
wherein the guide member includes a tapered surface which is formed inside the opening portion and has an inner dimension decreasing as separating away from the opening portion.

* * * * *